(12) United States Patent
Hattori et al.

(10) Patent No.: US 7,649,761 B2
(45) Date of Patent: Jan. 19, 2010

(54) SEMICONDUCTOR MEMORY DEVICE

(75) Inventors: Yukako Hattori, Yokkaichi (JP); Katsumi Abe, Yokohama (JP); Masami Masuda, Chigasaki (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/834,932

(22) Filed: Aug. 7, 2007

(65) Prior Publication Data

US 2008/0285324 A1 Nov. 20, 2008

(30) Foreign Application Priority Data

Aug. 7, 2006 (JP) ............................. 2006-214951

(51) Int. Cl.
*G11C 7/00* (2006.01)
(52) U.S. Cl. .................................... 365/51; 365/230.03
(58) Field of Classification Search .................... 365/51, 365/230.03
See application file for complete search history.

(56) References Cited

U.S. PATENT DOCUMENTS

| | | | | |
|---|---|---|---|---|
| 5,517,462 A | * | 5/1996 | Iwamoto et al. ............. | 365/195 |
| 5,586,076 A | * | 12/1996 | Miyamoto et al. ........... | 365/203 |
| 6,084,816 A | * | 7/2000 | Okamura ................ | 365/230.03 |
| 6,125,070 A | | 9/2000 | Tomishima | |
| 6,249,451 B1 | * | 6/2001 | Okamura ..................... | 365/63 |
| 6,452,824 B1 | * | 9/2002 | Okamura ..................... | 365/51 |
| 6,646,946 B2 | * | 11/2003 | Tomishima et al. .... | 365/230.03 |
| 2001/0019502 A1 | * | 9/2001 | Yamagata et al. ...... | 365/189.07 |
| 2001/0040827 A1 | * | 11/2001 | Dosaka et al. ......... | 365/189.01 |
| 2002/0015350 A1 | * | 2/2002 | Tomishima et al. .... | 365/230.03 |

FOREIGN PATENT DOCUMENTS

JP 2003-168287 6/2003

* cited by examiner

*Primary Examiner*—Michael T Tran
(74) *Attorney, Agent, or Firm*—Oblon, Spivak, McClelland, Maier & Neustadt, L.L.P.

(57) ABSTRACT

Shunt regions are formed at certain intervals in a memory cell array region as extending in a second direction. The shunt regions each include a contact formed to connect a word line or a signal line wired in the same direction to another metal wire. Extension regions are each formed of an extension of the shunt region in the data cache array region. Data input/output lines extend in a first direction and transfer data on bit lines simultaneously via a data cache array. Sense circuits are arranged around the data cache array and connected to the data input/output lines respectively. The data input/output lines are divided at a certain interval in the first direction. The divided portions are connected to respective leads formed in the extension region in the longitudinal direction thereof and connected to the sense circuits via the leads.

13 Claims, 6 Drawing Sheets

SEMICONDUCTOR MEMORY DEVICE

CROSS-REFERENCE TO RELATED APPLICATION

This application is based upon and claims the benefit of priority from prior Japanese Patent Application No. 2006-214951, filed on Aug. 7, 2006, the entire contents of which are incorporated herein by reference.

BACKGROUND OF THE INVENTION

1. Field of the Invention

The present invention relates to a semiconductor memory device, and more particularly to a semiconductor memory device having a plurality of data input/output lines and configured capable of multi-bit simultaneous read.

2. Description of the Related Art

A semiconductor memory device such as DRAM, SRAM, FeRAM and flash EEPROM comprises a plurality of memory cells arranged at intersections of word lines and bit lines. The bit line connected to the selected memory cell is connected indirectly via a gate circuit, a data latch, a sense amp, or a data buffer to a data input/output (I/O) line for use in data input/output. Selection of a word line and a bit line by decoders allows data to be read out of the memory cell onto the bit line and read out onto the corresponding data input/output line, thereby performing data read.

There is known a semiconductor memory device comprising a plurality of, for example, eight data input/output lines formed therein and sense circuits individually provided for respective data input/output lines for multi-bit simultaneous read (see JP-A 2003-168287, paragraphs 0023-0048, FIG. 1, for example). To the eight data input/output lines, eight bit lines simultaneously selected are connected via gate circuits and so forth and eight individual sense circuits operate originally for 8-bit simultaneous read.

An arrangement of a plurality of similarly configured memory cell arrays and connections of bit lines of the memory cell arrays to eight data input/output lines provided in each memory cell array can increase the number of simultaneously readable bits to 16, 24, 32 and so on. Cyclic, sequential activation of the plurality of memory cell arrays, or execution of so-called interleaved accesses can reduce the read cycle time even if the simultaneously readable data consists of 8 bits.

Such the semiconductor memory device capable of multi-bit simultaneous read has a problem associated with a wiring capacitance that is increased as the data input/output lines are elongated for wiring. In addition, an increase in integration density increases the junction capacitance. Therefore, the increase in integration density tends to increase the read time per one bit.

SUMMARY OF THE INVENTION

In one aspect the present invention provides a semiconductor memory device, comprising: a memory cell array arranged in a memory cell array region and including a plurality of memory cells formed at intersections of word lines extending in a first direction and bit lines extending in a second direction orthogonal to the first direction; a data cache array arranged in a data cache array region and including data caches arrayed to temporarily store data read out of the memory cells; a plurality of shunt regions formed at certain intervals in the memory cell array region as extending in the second direction and each including a contact formed to connect the word line or a signal line wired in the same direction to another metal wire; a plurality of extension regions each formed of an extension of the shunt region in the data cache array region; a plurality of data input/output lines formed extending in the first direction and arranged to simultaneously transfer data on the simultaneously selectable bit lines via the data cache array; and a plurality of sense circuits arranged around the data cache array and connected to the plurality of data input/output lines respectively, wherein the data input/output lines are divided at a certain interval in the first direction, wherein the divided portions are connected to respective leads formed in the extension region in the longitudinal direction thereof and connected to the sense circuits via the leads.

DETAILED DESCRIPTION OF THE EMBODIMENTS

The embodiments of the present invention will now be described in detail with reference to the drawings.

First Embodiment

Figure 1:
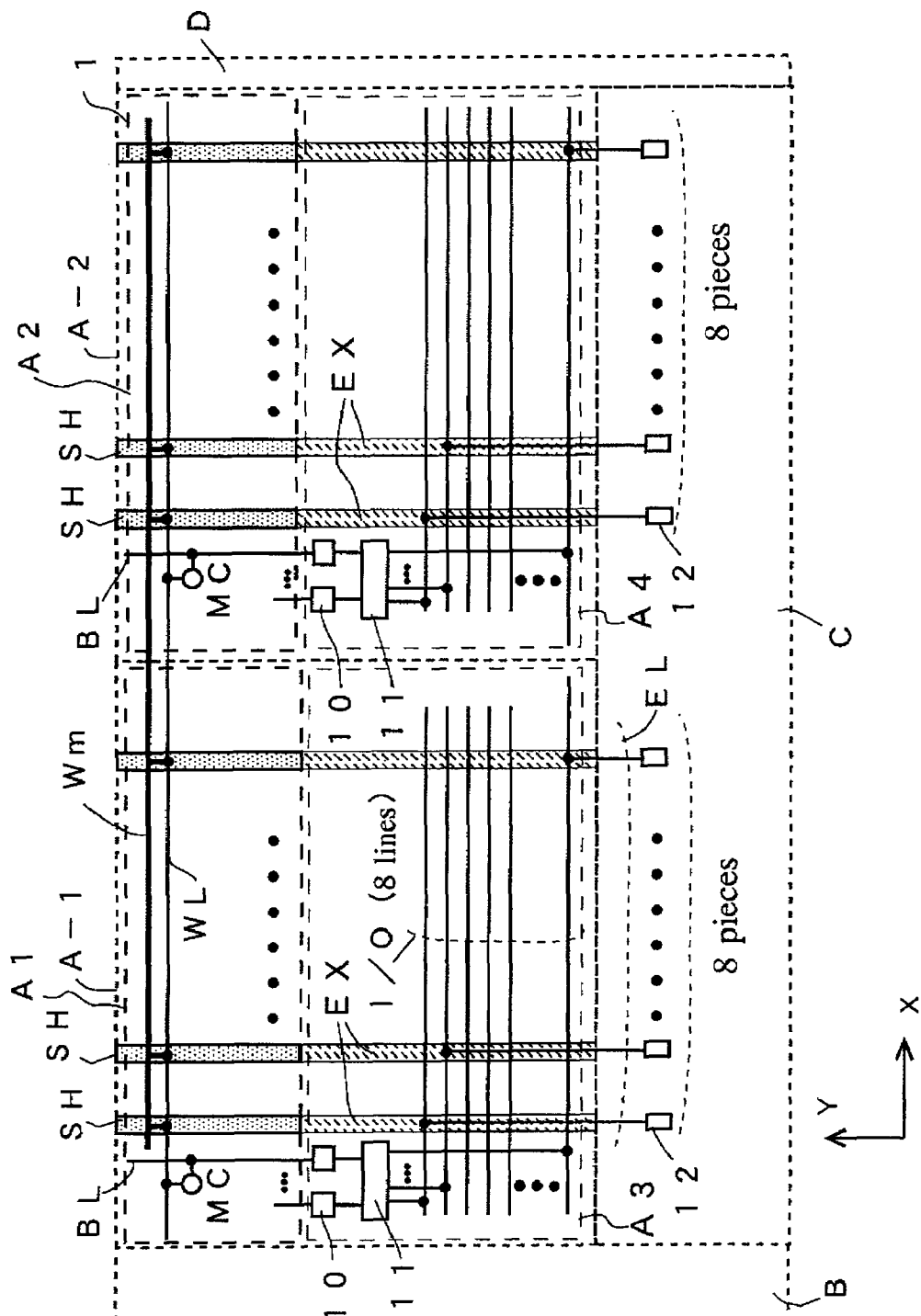
FIG. 1 shows a plane layout of a semiconductor memory device according to a first embodiment of the present invention.

FIG. 1 shows a plane layout of a semiconductor memory device according to a first embodiment of the present invention. As shown in FIG. 1, the semiconductor memory device comprises regions A-1, A-2, B, C, D. In the regions A-1 and A-2, one memory cell array block A1 and one data cache array block A3, and one memory cell array block A2 and one data cache array block A4 are formed, respectively.

The memory cell array blocks A1, A2 form one memory cell array 1. The region B is a peripheral region conventionally used as a wiring region, which is not utilized in the present embodiment. The region C is a peripheral circuit region used to form peripheral circuits including sense circuits 12 described below. The region D is a narrow peripheral region with no space for wiring and so forth.

The memory cell array blocks A1, A2 include a plurality of word lines WL extending in the X-direction (first direction) and a plurality of bit lines BL extending in the Y-direction (second direction) of which intersections are provided with memory cells MC. A word line WL and a bit line BL can be selected by decoders, not shown, to read out data onto the selected bit line BL from a memory cell MC located at the intersection.

The data cache array blocks A3, A4 on the other hand include a plurality of sense amps and data latches 10, and a plurality of column switches 11. The sense amps and data latches 10 and the column switches 11 form data cache circuits. Namely, the sense amp/data latch 10 is connected to each bit line BL. The data sensed and amplified at the sense amp/data latch 10 is transferred via the column switch 11 to a plurality of (eight in this example) data input/output lines I/O formed extending in the X-direction. In this embodiment, for execution of multi-bit simultaneous read, the bit lines BL are selected simultaneously in one memory cell array block A1 or A2. Then, pieces of data from the plurality of bit lines BL are transferred via the column switch 11 to the same number of data input/output lines I/O. The data input/output lines I/O in this embodiment are divided at a certain interval in the X-direction on the boundary of the regions A-1 and A-2 in this example. In the conventional memory configuration as shown in FIG. 1, the data input/output lines I/O are formed continuously over the regions A-1 and A-2. In such the case, the data input/output lines I/O have a longer wiring length, which increases the wiring capacitance and the junction capacitance and may extend the data read time. In the present embodiment, the above division can reduce the wiring capacitance and the junction capacitance associated with the data input/output lines I/O, shortening the 1-bit read time, achieving a faster read cycle.

The regions A-1 and A-2 include shunt regions SH formed per a plurality of bit lines BL in the X-direction at certain intervals. The shunt regions SH are regions formed as gap sections, in order to relieve the gate wiring delay, such that the word line WL having a larger wiring capacitance or a signal line wired in the same direction and a metal wire Wm running in parallel make contacts at certain intervals. The regions are formed in the Y-direction as the longitudinal direction like the bit lines BL.

The data cache array blocks A3, A4 include extension regions EX formed therein, which are formed by extending shunt regions SH in the Y-direction. In the memory cell array blocks A1, A2, the bit line BL extends in the Y-direction and connects to the sense amp/data latch 10 and the column switch 11. Therefore, the sense amp/data latch 10 and the column switch 11 are not formed in the extension regions EX formed in the data cache array blocks A3, A4.

In the region C serving as the peripheral circuit region, the sense circuits 12 connected to the data input/output lines I/O are arranged as described above. The sense circuits 12 are formed corresponding to the number of the data input/output lines I/O, 16 in total, each 8 for the divided 8 data input/output lines I/O, that is, in the respective regions A-1, A-2 in this example. Namely, in the present embodiment, the data input/output lines I/O are halved at the boundary of the regions A-1, A-2, and the divided two halves are connected to 8 sense circuits 12 each, 16 in total. Therefore, independent and simultaneous operation of the 16 sense circuits 12 enables 16-bit simultaneous data read. The conventional configuration of the data input/output lines I/O not divided only enables 8-bit simultaneous data read. With this regard, the present embodiment is possible to shorten the data read time than the conventional device. It also can be configured to alternately access the memory cell array blocks A1, A2 to execute 8-bit interleaved accesses.

The present embodiment thus configured makes it possible to increase the number of the sense circuits 12 connectable to one data input/output line I/O than the conventional device in which the data input/output lines I/O are connected continuously over the regions A-1 and A-2. Generally expressing, n-division of the data input/output lines I/O allows the number of simultaneous readable bits to be multiplied by n.

The sense circuits 12 are connected to the data input/output lines I/O via leads EL formed within the extension regions EX in the longitudinal direction thereof. The shunt regions SH are empty regions existing in the memory cell array with no wire running in the longitudinal direction thereof. Therefore, the extension regions EX are also empty regions. Thus, the present embodiment uses the extension regions EX as lead paths for the data input/output lines I/O to the sense circuits 12.

The conventional device applies such a layout that uses the lead region B for the data input/output lines to the sense circuits. In this layout, however, the data input/output lines have a longer wiring length, which increases the wiring capacitance and the junction capacitance as a problem. In the present embodiment, the data input/output lines are divided at a certain interval in the X-direction and, in addition to this, the sense circuits 12 are connected to the data input/output lines I/O via the leads EL formed along the extension regions EX, as described above. Therefore, the wiring length of the data input/output line including the lead EL becomes particularly shorter than the conventional device and reduces the wiring capacitance and the junction capacitance to achieve a shortened read time and a faster read cycle.

Second Embodiment

Figure 2:
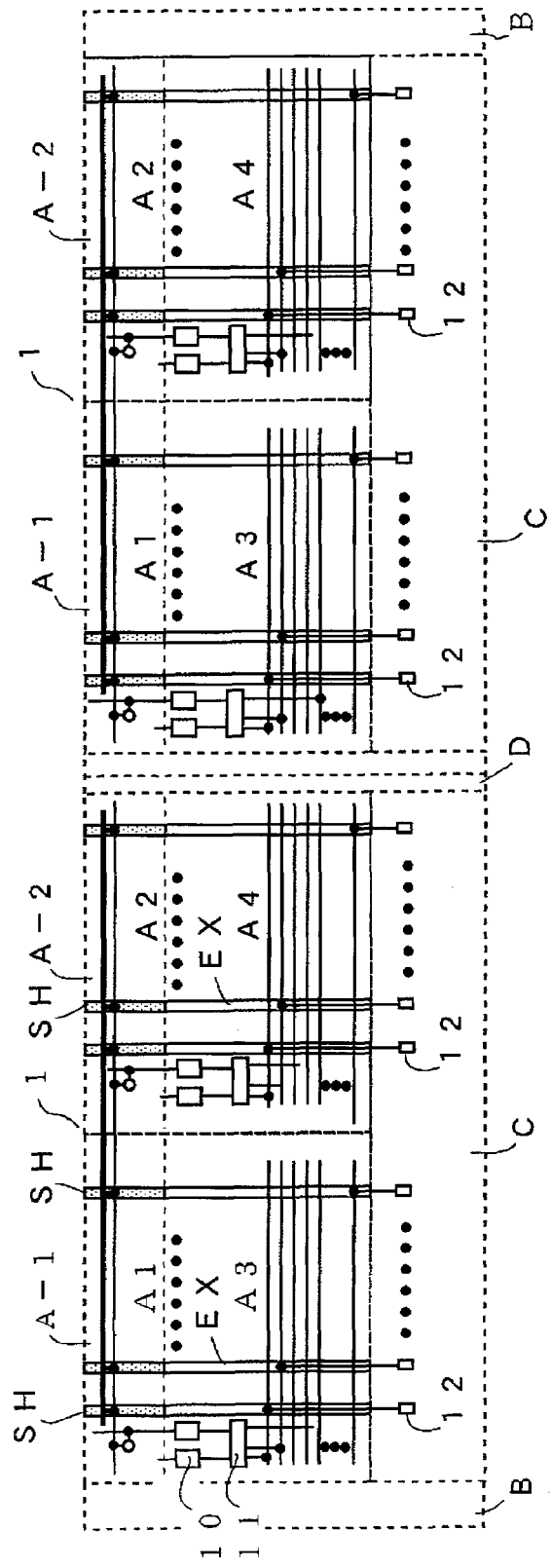
FIG. 2 shows a plane layout of a semiconductor memory device according to a second embodiment of the present invention.

FIG. 2 is referenced next to describe a plane layout of a semiconductor memory device according to a second embodiment of the present invention. The same components as those in the first embodiment are denoted with the same reference numerals and omitted from the following detailed description. The semiconductor memory device of this embodiment comprises two memory cell arrays 1 arranged side by side in the X-direction, each provided with the memory cell array blocks A1, A2 similar to that in FIG. 1. The memory cell arrays 1 include 16 sense circuits each, 32 in total (16×2). Others are similar to those in the first embodiment including the data input/output lines I/O divided at the boundary of the regions in each memory cell array 1. Namely, one memory cell array 1 is capable of 16-bit simultaneous read, and accordingly two memory cell arrays 1 are capable of achieving 16-bit interleaved accesses.

Figure 3:
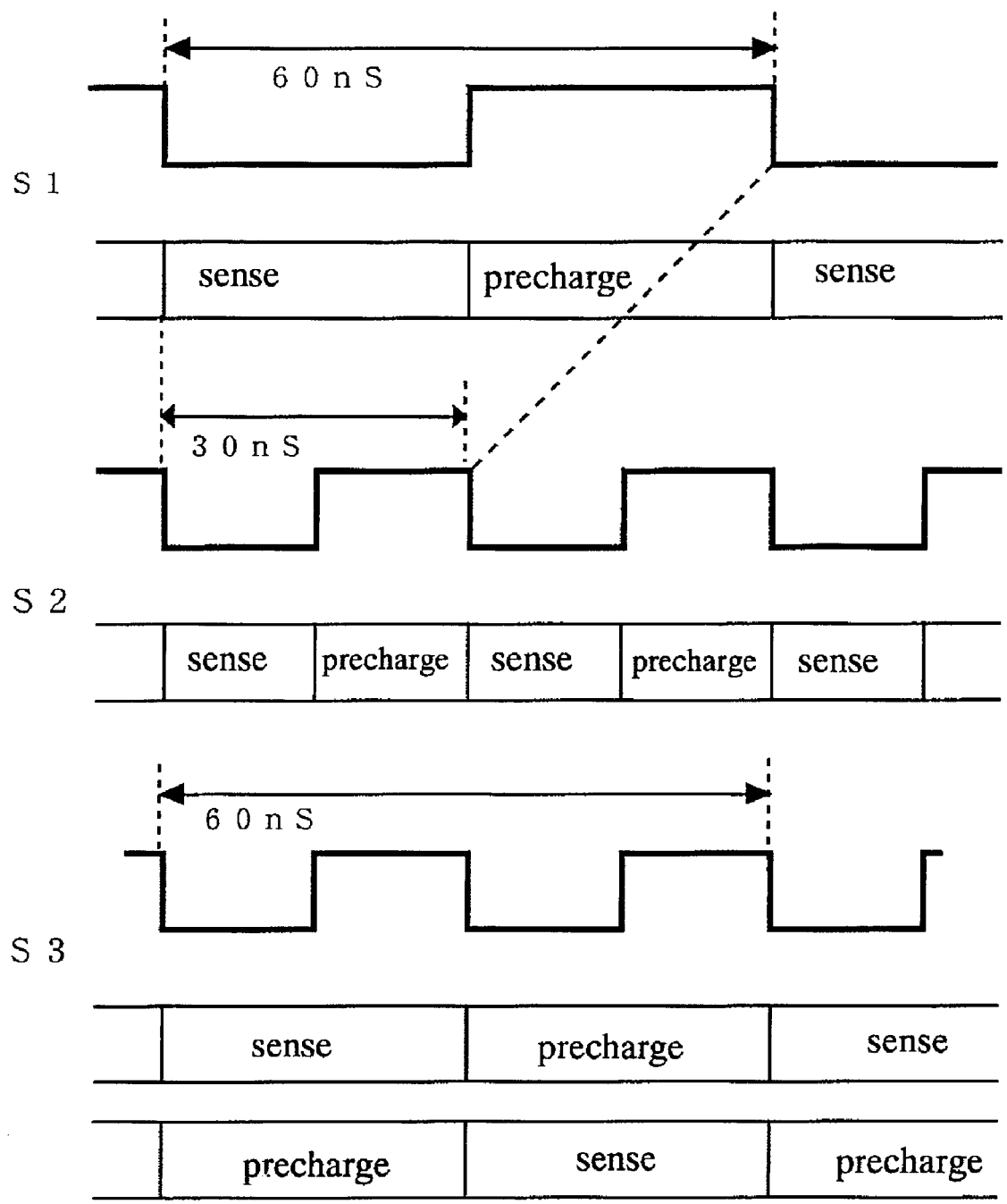
FIG. 3 illustrates operation when interleaved accesses are implemented in the second embodiment.

The execution of the interleaved accesses in the present embodiment has an advantage, which is described herein with reference to FIG. 3. The 32 sense circuits 12 shown in FIG. 2 may be operated simultaneously with no execution of interleaved accesses, for example. In such the case, it is sufficiently possible for each sense circuit 12 to repeat data sense and pre-charge within a cycle of 60 nS as shown with S1 in FIG. 3. It is difficult, however, for each sense circuit 12 to ensure the time for data sense and pre-charge within a cycle of 30 nS as shown with S2 in FIG. 3 without causing a malfunction.

On the other hand, the interleaved accesses may be executed to each of the memory cell arrays 1 in two systems, as data-sense in one while pre-charge in the other, as shown with S3 in FIG. 3. In this case, it is sufficient to execute data sense and pre-charge within a cycle of 60 nS per one system without causing a malfunction while shortening the data read time. In the case of the interleaved accesses, it is not required to execute different operations such as data-sense in one while pre-charge in the other but both the two systems may be configured to simultaneously execute data-sense and pre-charge.

Third Embodiment

Figure 4:
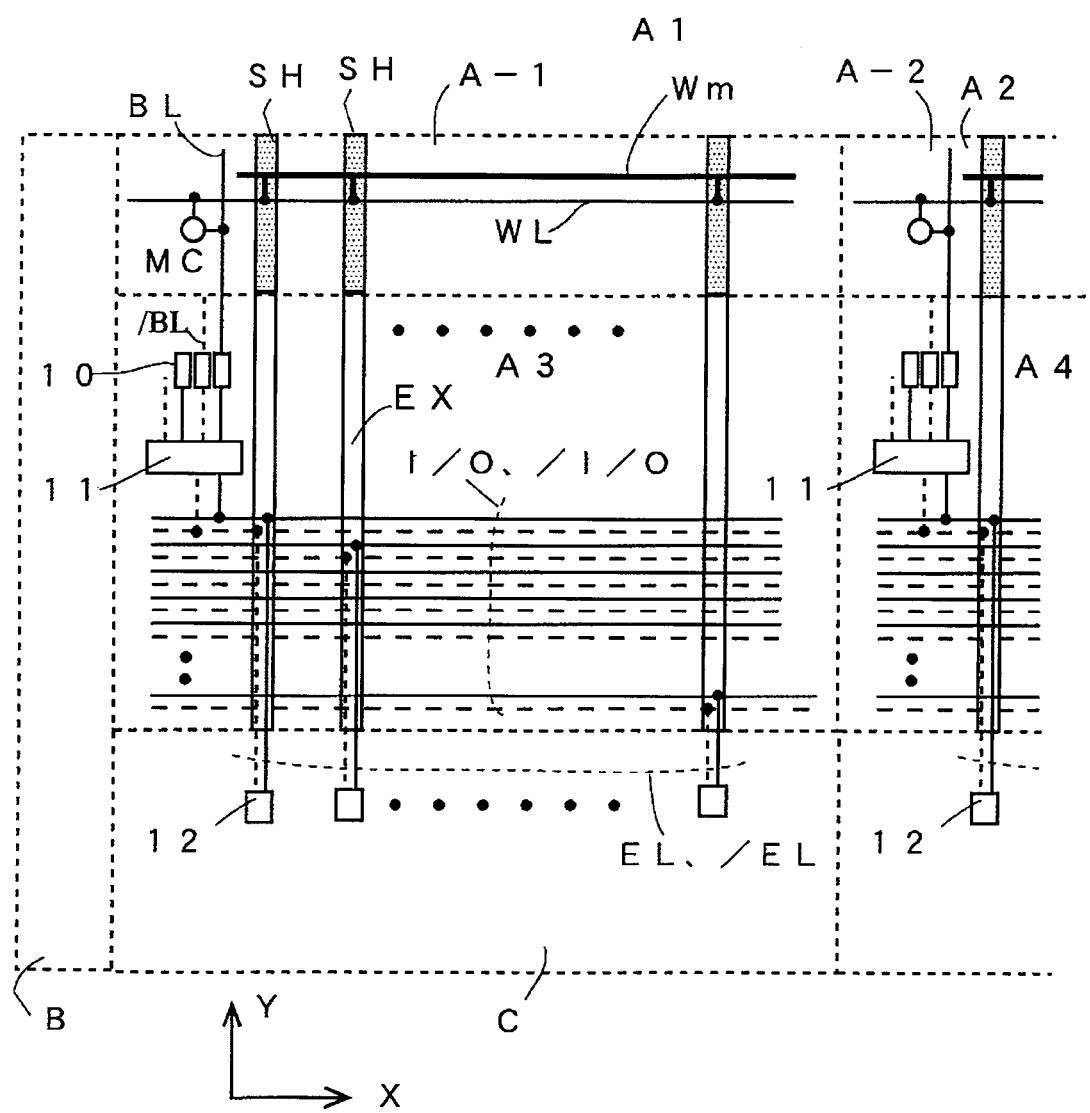
FIG. 4 shows a plane layout of a semiconductor memory device according to a third embodiment of the present invention.
Figure 5:
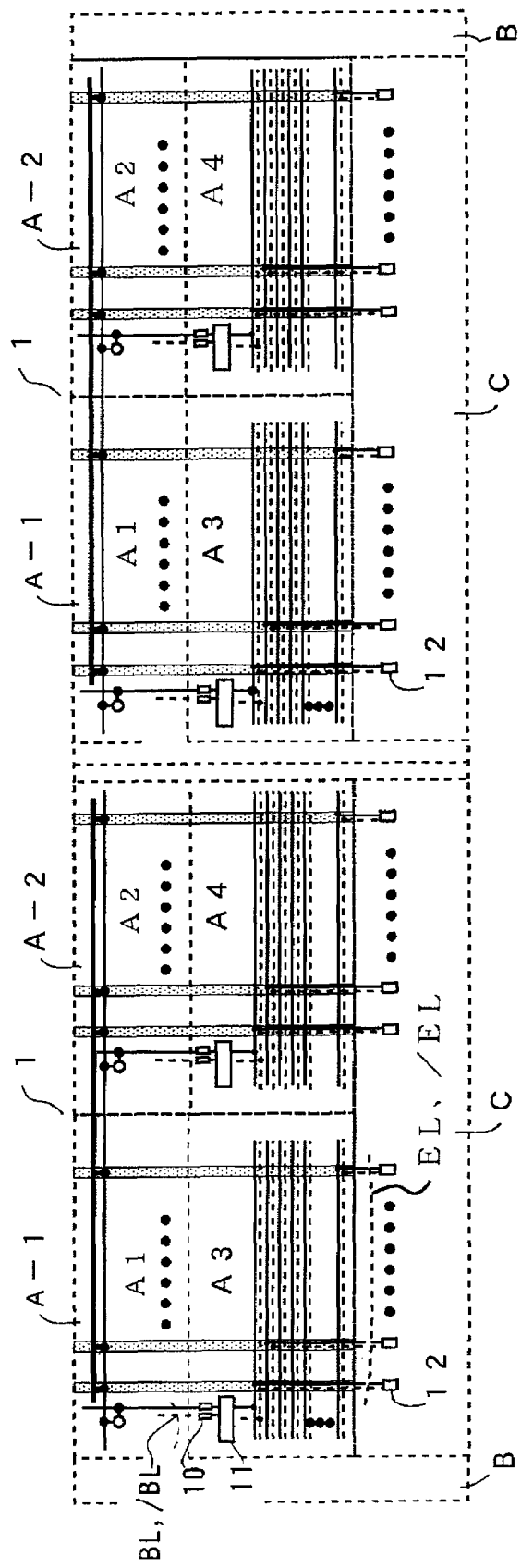
FIG. 5 shows a variation of the third embodiment.

A semiconductor memory device according to a third embodiment of the present invention is described next with reference to FIG. 4. The same components as those in the first embodiment are denoted with the same reference numerals and omitted from the following detailed description. This embodiment is configured to simultaneously read sets of data from bit line pairs of the bit lines BL and complementary bit lines /BL into data line pairs of the data input/output lines I/O and complementary data input/output lines /I/O. The data input/output lines I/O and complementary data input/output lines /I/O are connected to the leads EL and leads /EL. The leads EL and /EL are arranged within the extension regions EX in the longitudinal direction thereof. Accordingly, the length of the data input/output lines I/O and /I/O are as short as in the above embodiments. Others are similar to those in the above embodiments. It is also possible to arrange a plurality of such memory cell arrays 1 side by side in the X-direction as shown in FIG. 5 similar to the example of FIG. 2.

Figure 6:
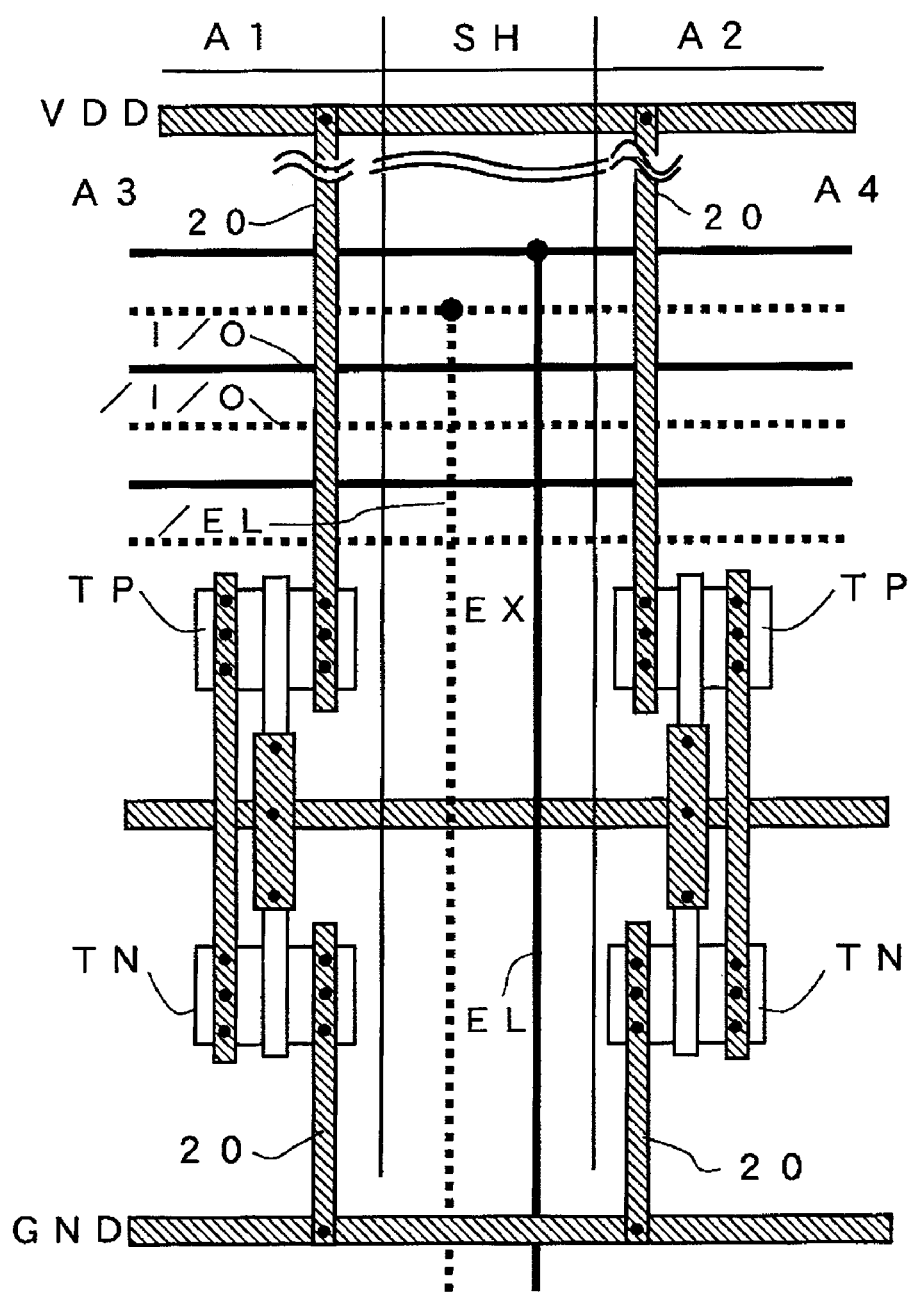
FIG. 6 shows a variation of the embodiment of the present invention.

The embodiments of the invention have been described above though the present invention is not limited to these but rather can be given various variations, replacements, diversions, deletions and so forth. For example, in order to prevent the signals flowing in the leads EL and /EL arranged within the extension region EX from suffering the disturbance, it is also possible to arrange wires in which almost constant current flows, such as power lines 20, along the extension region EX as shown in FIG. 6. The power lines 20 are supplied with a certain supply voltage VDD and the ground voltage GND. Accordingly, they may be used as shield lines for shielding the disturbance affecting on the signals flowing in the leads EL and /EL. In the example of FIG. 6, the sense amp/data latch 10 contains a CMOS inverter consisting of a p-type MOS transistor TP and an N-type MOS transistor TN. These transistors have respective sources, which are connected to the power lines 20 for supplying the supply voltage VDD and the ground voltage GND. These power lines 20 are configured to sandwich the leads EL and /EL therebetween. This configuration can prevent noises from mixing on the leads EL and /EL without wiring new shield lines for shielding the leads EL and /EL.

What is claimed is:

1. A semiconductor memory device, comprising:
   a memory cell array arranged in a memory cell array region and including a plurality of memory cells formed at intersections of word lines extending in a first direction and bit lines extending in a second direction orthogonal to said first direction;
   a data cache array arranged in a data cache array region and including data caches arrayed to temporarily store data read out of said memory cells;
   a plurality of shunt regions formed at certain intervals in said memory cell array region as extending in said second direction and each including a contact formed to connect said word line or a signal line wired in the same direction to another metal wire;
   a plurality of extension regions each formed of an extension of said shunt region into said data cache array region;
   a plurality of data input/output lines formed extending in said first direction and arranged to simultaneously transfer data on said simultaneously selectable bit lines via said data cache array; and
   a plurality of sense circuits arranged around said data cache array and connected to said plurality of data input/output lines respectively,
   wherein said data input/output lines are divided at a certain interval in said first direction, wherein said divided portions are connected to respective leads formed in said extension region in the longitudinal direction thereof and connected to said sense circuits via said leads.

2. The semiconductor memory device according to claim 1, wherein said data input/output lines are divided on a boundary of a plurality of memory cell array blocks contained in said memory cell array.

3. The semiconductor memory device according to claim 2, wherein said memory cell array blocks divide said memory cell array region into two or more in said first direction.

4. The semiconductor memory device according to claim 1, wherein said data cache array includes a sense amp/data latch connected to said bit line, and a column switch operative to transfer data sensed and amplified at said sense amp/data latch to said data input/output line.

5. The semiconductor memory device according to claim 1, wherein said memory cell array is one of a plurality of memory cell arrays arranged in said first direction, wherein said sense circuits are configured to execute interleaved accesses to said plurality of memory cell arrays.

6. The semiconductor memory device according to claim 1, wherein said data input/output lines include
   a first data input/output line provided to transfer a piece of data on said bit line, and
   a second data input/output line provided to transfer a piece of dada on a complementary bit line paired with said piece of data on said bit line,
   wherein said leads include a first lead connected to said first data input/output line, and a second lead connected to said second data input/output line.

7. The semiconductor memory device according to claim 6, wherein said data input/output lines are divided on a boundary of a plurality of memory cell array blocks contained in said memory cell array.

8. The semiconductor memory device according to claim 7, wherein said memory cell array blocks divide said memory cell array region into two or more in said first direction.

9. The semiconductor memory device according to claim 6, wherein said data cache array includes a sense amp/data latch connected to said bit line, and a column switch operative to transfer data sensed and amplified at said sense amp/data latch to said data input/output line.

10. The semiconductor memory device according to claim 1, further comprising a signal line arranged along said extension region to supply a certain signal to a semiconductor device contained in said data cache.

11. The semiconductor memory device according to claim 10, wherein said data input/output lines are divided on a boundary of a plurality of memory cell array blocks contained in said memory cell array.

12. The semiconductor memory device according to claim 11, wherein said memory cell array blocks divide said memory cell array region into two or more in said first direction.

13. The semiconductor memory device according to claim 10, wherein said data cache array includes a sense amp/data latch connected to said bit line, and a column switch operative to transfer data sensed and amplified at said sense amp/data latch to said data input/output line.

* * * * *